United States Patent
Wensley et al.

(10) Patent No.: US 6,566,227 B2
(45) Date of Patent: May 20, 2003

(54) STRAP RESISTANCE USING SELECTIVE OXIDATION TO CAP DT POLY BEFORE STI ETCH

(75) Inventors: Paul Wensley, Poughquag, NY (US); Martin Commons, Stormville, NY (US); Tobias Mono, Dresden (DE); Veit Klee, Pleasant Valley, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/929,334

(22) Filed: Aug. 13, 2001

(65) Prior Publication Data

US 2003/0032257 A1 Feb. 13, 2003

(51) Int. Cl.$^7$ ................................. H01L 21/76
(52) U.S. Cl. ................. 438/430; 438/424; 438/239; 438/243; 438/248
(58) Field of Search ................. 438/400, 424, 438/430, 239, 243, 248

(56) References Cited

U.S. PATENT DOCUMENTS 5,614,431 A  *  3/1997 DeBrosse
5,874,758 A  *  2/1999 DeBrosse .................... 257/305
6,310,375 B1 * 10/2001 Schrems ..................... 257/301

* cited by examiner

*Primary Examiner*—Long Pham
(74) *Attorney, Agent, or Firm*—Slater & Matsil, L.L.P.

(57) ABSTRACT

A method of providing shallow trench (143) isolation for a semiconductor wafer (100). Trenches (113) are formed within a first semiconductor material (112) and a pad nitride (114), leaving a portion of first semiconductor material (112) and pad nitride (114) in a region between the trenches (113). A second semiconductor material (116) is deposited over the trenches (113) to fill the trenches (113) to a height below the first semiconductor material (112) top surface. A first insulator (130) is selectively formed over the second semiconductor material (116). The pad nitride (114) and a portion of the first semiconductor material (112) between the trenches (113) are removed to isolate element regions of the wafer (100) and form straps (142) having a low resistance.

24 Claims, 4 Drawing Sheets

STRAP RESISTANCE USING SELECTIVE OXIDATION TO CAP DT POLY BEFORE STI ETCH

TECHNICAL FIELD

The present invention relates generally to the fabrication of semiconductor integrated circuit (IC) structures, and more particularly to the formation of shallow trench isolation (STI) structures in IC devices.

BACKGROUND

Semiconductor devices are used in a variety of electronic applications, such as personal computers and cellular phones, for example. One such semiconductor product widely used in electronic systems for storing data is a semiconductor memory, and one common type of semiconductor is a dynamic random access memory (DRAM).

A DRAM typically includes millions or billions of individual DRAM cells, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

Memory devices are typically arranged in an array of memory cells. A source/drain region of the cell access FET is coupled to a bitline, and the other source/drain region is coupled to a plate of a respective storage capacitor. The other plate of the capacitor is coupled to a common plate reference voltage. The gate of the transistor is coupled to a wordline. The storing and accessing of information into and from memory cells is achieved by selecting and applying voltages to the wordlines and bitlines.

In fabricating semiconductor devices such as DRAM's, shallow trench isolation (STI) is a technique used to provide electrical isolation between various element regions. FIGS. 1–3 illustrate a prior art STI technique used to isolate active areas of a DRAM array. A crystalline silicon 12 substrate covered with a layer of pad nitride 14 (e.g., 200 nm of silicon nitride) is patterned with trenches 13, e.g. deep trenches, may have areas of crystalline silicon substrate 12 in regions therebetween.

For example, two deep trenches 13 are shown in FIG. 1, which may comprise two storage cells or capacitors of a DRAM. An insulating collar 15 is formed within each trench 13 and comprises a thin oxide liner, for example. The trenches 13 are filled with doped polycrystalline silicon (polysilicon) 16, which is etched back to a depth of, e.g., between 300 to 600 Angstroms below the silicon 12 surface.

Exposed portions of the pad nitride layer 14 and the polysilicon 16 are covered with a nitride frame 18. The nitride frame 18 may comprise, for example, 20 nm of silicon nitride. A hard mask 20 comprising boron-doped silicon glass (BSG), or alternatively, tetraethoxysilane (TEOS), as examples, is deposited over the nitride frame 18.

An anti-reflective coating (ARC) 22 comprising, for example, an organic polymer, may be deposited over the hard mask 20, and a resist 24 typically comprising an organic polymer is deposited over the ARC 22. ARC 22 is typically used to reduce reflection during exposure because reflection can deteriorate the quality of the image being patterned.

The resist 24 is exposed, patterned and etched to remove exposed portions, typically in a positive exposure process, although, alternatively, a negative exposure process may be used to pattern the resist 24.

After an ARC 22 open step, the semiconductor wafer 10 is exposed to an etch process, e.g. an anisotropic etch e.g. in a plasma reactor, to transfer the resist 24 pattern to the hard mask 20, the nitride frame 18 and nitride layer 14, as shown in FIG. 2. Reactive ion etching (RIE) is often used to transfer the pattern to the hard mask 20, the nitride frame 18 and nitride layer 14. The etch may stop on the polysilicon 16 and silicon 12, or alternatively, the etch may include a slight over-etch of silicon 12 to ensure that no portions of the nitride layer 14 remain over the top surface of the silicon 12. The active areas (AA) are protected by the hard mask 20 and therefore are not etched.

The resist 24 and the ARC 22 are removed, e.g., in a dry strip using oxygen plasma, as shown in FIG. 3. Portions of the wafer 10 not covered by the hard mask 20 are etched to form shallow trenches within the wafer 10 using the hard mask 20 to pattern the trenches, opening the STI area 40, as shown in FIG. 3. The polysilicon 16, collars 15, and silicon 12 are etched off to a fixed depth, for example, 300 to 350 nanometers, which forms the shallow trench isolation at 40.

The hard mask 20 is typically removed prior to any further processing steps. Usually, the trench 40 formed in the silicon 12 and polysilicon 16 is filled with an insulator such as an oxide, and the wafer 10 is then polished by a chemical-mechanical polish (CMP) process down to at least the pad nitride layer 14 surface, leaving oxide in the trenches 40 to provide isolation between devices (not shown). The top portion 42 of polysilicon 16 functions as the strap by providing an electrical connection between the deep trench 13 capacitor and the active area AA, which may comprise a transistor of a memory cell (not shown). The strap 42 is also referred to in the art as a buried strap. If there is no overlap (e.g. at 42) of polysilicon 16 and silicon 12, then no electrical connection is made between a memory cell capacitor and access transistor, resulting in a defective DRAM device 10.

A problem with the prior art method and structure shown in FIGS. 1–3 is that the strap 42 resistance can be high, which makes the storing and retrieving of information to and from the DRAM storage capacitor slow. If the strap 42 has a high resistance, a longer amount of time is required to charge up the storage capacitor. Also, a high strap 42 resistance requires a large amount of power, because the surrounding circuitry (not shown) must be used longer, thereby using more current and power.

What is needed in the art is an STI method resulting in a lower strap resistance for memory devices.

SUMMARY OF THE INVENTION

The present invention provides a method of shallow trench isolation for semiconductor devices.

In accordance with a preferred embodiment, a selective TEOS material is used to cap deep trenches prior to active area hard mask deposition, lithography and etch steps. A first insulator is selectively formed over deep trench polysilicon fill, with none of the first insulator material being formed over the pad nitride layer. The first insulator acts as a protective barrier for the strap region during subsequent processing steps, resulting in a strap region having a lower resistance.

Disclosed is a preferred embodiment for a STI method for a semiconductor wafer, comprising providing a wafer including a first semiconductor material, the first semiconductor material comprising element regions; depositing a pad nitride over the first semiconductor material; forming at least two trenches within the first semiconductor material and pad nitride, leaving a portion of first semiconductor material and pad nitride in a region between the two trenches; depositing a second semiconductor material over the trenches to fill the trenches to at least at height below the first semiconductor material top surface; selectively forming a first insulator over the second semiconductor material; and removing the pad nitride and a portion of the first semiconductor material between at least two trenches to isolate element regions of the wafer.

Also disclosed is a preferred embodiment for a method of manufacturing a memory device, the method comprising providing a semiconductor wafer comprising a first semiconductor material; depositing a pad nitride over the first semiconductor material; forming a plurality of memory cells on the semiconductor wafer, each memory cell including a deep trench proximate an element region, the deep trenches being filled with a second semiconductor material to a height below the top of the first semiconductor material; selectively forming a first insulator over the second semiconductor material; and removing the pad nitride and a portion of the first semiconductor material between at least two deep trenches to isolate the element regions of the wafer.

Further disclosed is a preferred embodiment for a method of manufacturing a memory device, the method comprising providing a semiconductor wafer comprising a first semiconductor material; depositing a pad nitride over the first semiconductor material; forming a plurality of memory cells on the semiconductor wafer, each memory cell including a deep trench proximate an element region, the deep trenches being filled with a second semiconductor material to a height below the top of the first semiconductor material; exposing the wafer to a gas comprising ozone to selectively form a first insulator over only the second semiconductor material, wherein the first insulator is not formed over the pad nitride; and removing the pad nitride and a portion of the first semiconductor material between at least two of the deep trenches to isolate the element regions of the wafer.

Advantages of embodiments of the invention include providing a memory device having a lower strap resistance. The lowered strap resistance allows for a higher speed memory device than in the prior art, e.g., the time required for the storage and retrieval of information in the deep trench capacitor is reduced. The lowered strap resistance also allows for a lower power memory device, because the surrounding supportive circuitry is required to be used for less time than in prior art memory devices, thus embodiments of the invention require lower total power consumption than in the prior art. A thinner hard mask may be used, and a strap that is self-aligned is provided. Embodiments of the invention also result in improved yields.

BRIEF DESCRIPTION OF THE DRAWINGS

The above features of embodiments of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

A description of preferred embodiments of the present invention will be discussed, followed by a discussion of some advantages of embodiments of the invention. Only two trenches are shown in each figure, although many trenches and other components of memory cells are present in the semiconductor devices shown.

FIGS. 4–10 show cross-sectional views of a preferred embodiment of the present STI method in various stages of fabrication. While the STI process described herein may be used in a variety of semiconductor devices, embodiments of the invention are described and shown in use as a method of isolating active areas of a DRAM array.

Figure 4:
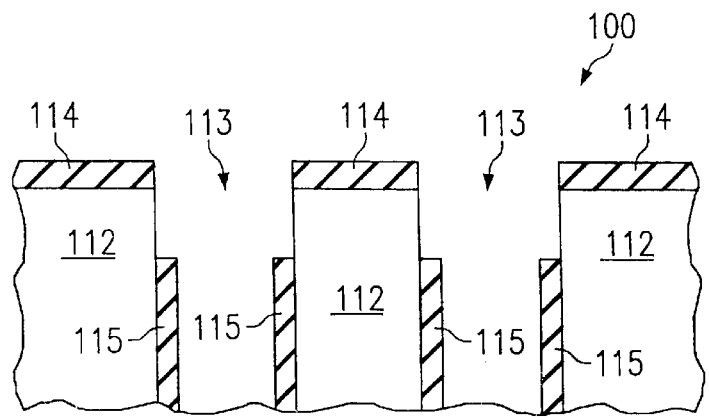
FIGS. 4–10 show cross-sectional views of a preferred embodiment of the present invention at various stages of fabrication.

FIG. 4 shows a cross-sectional view of a semiconductor memory wafer 100 having a first semiconductor material 112 preferably comprising a substrate. The first semiconductor material 112 preferably comprises a substrate of single-crystalline silicon, for example, and may include other semiconductor elements, e.g. transistors, diodes, etc. The first semiconductor material 112 may also include epitaxially grown silicon over other layers.

A layer of pad nitride 114 is deposited over the first semiconductor material 112. Pad nitride 114 preferably comprises an insulative nitride and may, for example, comprise 120–200 nm of SiN. The pad nitride 114 and first semiconductor material 112 are patterned with trenches 113, e.g., deep trenches (DTs), which have regions of first semiconductor material 112 centered therebetween. Deep trenches 113 may be, for example, 6 to 10 μm deep.

A collar 115 is deposited within the trenches 113. Collar 115 preferably comprises an insulator such as $SiO_2$ having a thickness of 20 to 70 nm. Alternatively, collar 115 may comprise SiN, for example.

Figure 5:
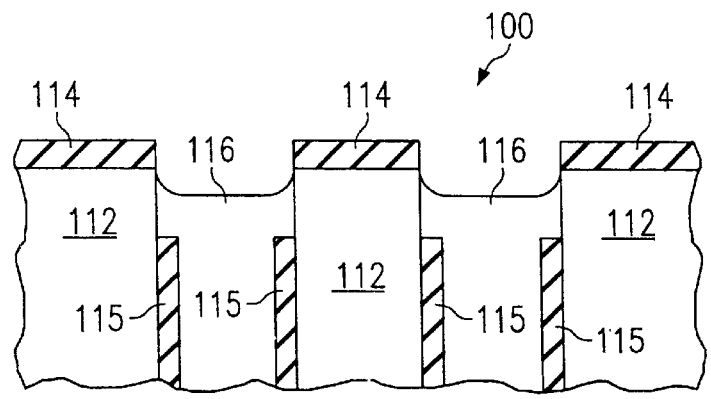

The trenches 113 are filled with second semiconductor material 116, shown in FIG. 5. Second semiconductor material 116 preferably comprises polysilicon and alternatively may comprise other conductive materials, for example. The second semiconductor material 16 is etched back to a desired level below the top surface of the first semiconductor material 112, e.g., to a level between 300 to 600 Angstroms below the top surface of the first semiconductor material 112. The deep trenches 113, collar 115 and polysilicon 216 may form elements of a storage capacitor of a DRAM, for example.

Figure 6:
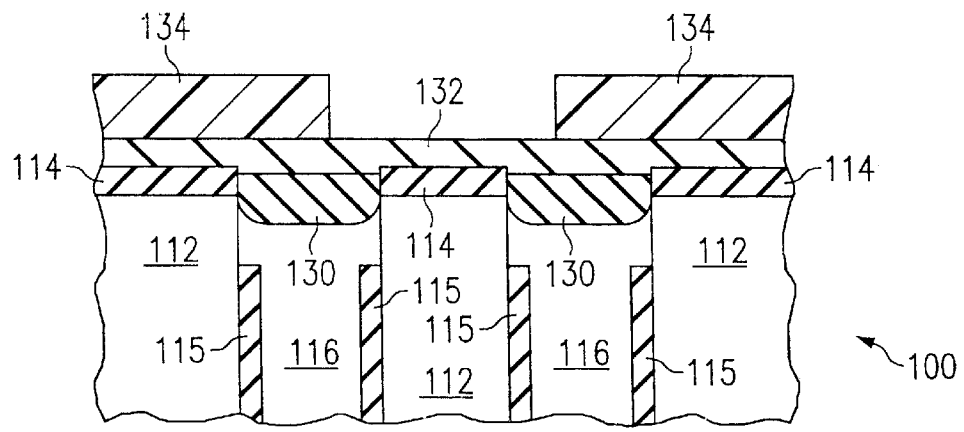

In accordance with a preferred embodiment of the present invention, a first insulator 130 cap is selectively formed over the second semiconductor material, as shown in FIG. 6. Selectively forming the first insulator 130 preferably comprises exposing the wafer 100 to a gas comprising ozone to form an oxide, and more preferably comprises exposing the wafer to TEOS $O_3$ to form silicon dioxide. Preferably, selectively forming the first insulator 130 does not comprise forming the first insulator 130 over the pad nitride 114; that is, a process is used that is selective to silicon and thereby does not react with the pad nitride 114 to leave first insulator 130 material deposited thereon.

A hard mask 132 preferably comprising TEOS and alternatively comprising BSG, as examples, is deposited over the pad nitride 114 and first insulator 130. Preferably, hard mask 132 comprises about 100 nm of TEOS. The use of first insulator material 130 to cap the deep trench allows the use of a relatively thin 100 nm hard mask 132 which is advantageous, because thicker masks (>130 nm) are not compatible with 0.1 um logic technology. Embodiments of the present invention are therefore particularly useful in semiconductor products that combine DRAM and logic in a single process flow.

An ARC (not shown) may be deposited over the hard mask 132. A resist 134 preferably comprising an organic polymer is deposited over the hard mask 132 or ARC. The resist 134 is exposed, patterned and etched to remove exposed portions, typically in a positive exposure process, although, alternatively, a negative exposure process may be used to pattern the resist 134.

Figure 7:
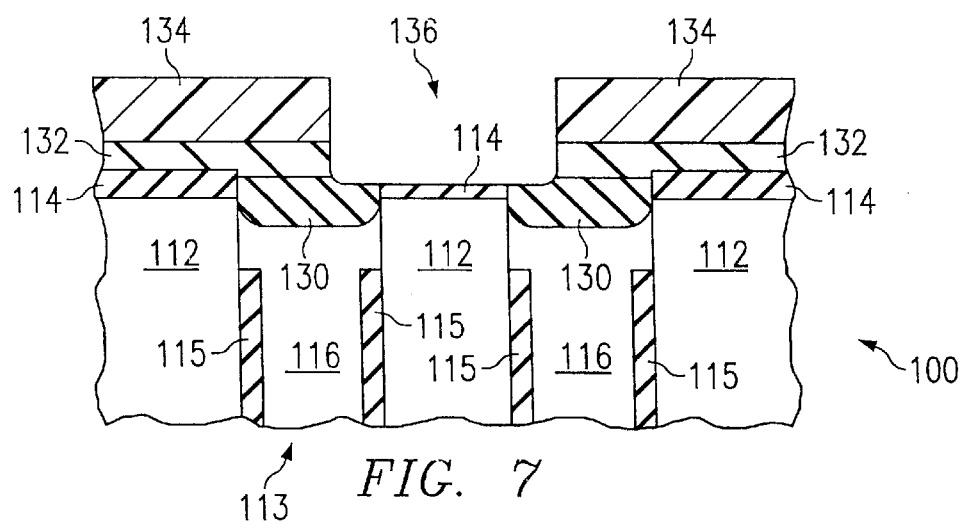

The resist 134 pattern is transferred to the hard mask 132 layer (a hard mask open step), as shown in FIG. 7. Preferably the hard mask 132 is opened by exposing the semiconductor wafer 100 to an dry etchant, e.g. an anisotropic etch in a plasma etch reactor. Alternatively, RIE may be used to transfer the resist 134 pattern to the hard mask 132, for example. A small amount of first insulator 130 and pad nitride 114 between deep trenches 113 may be removed during the hard mask 132 open step.

Figure 8:
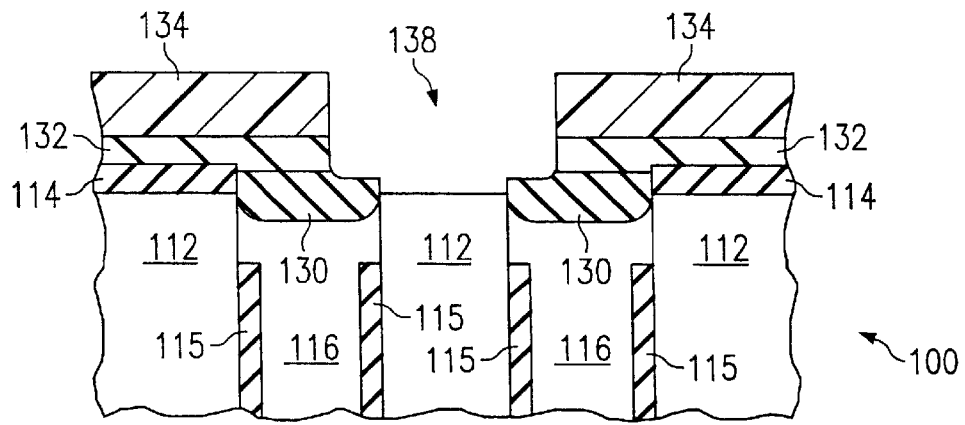

After the hard mask 132 open, the pad nitride 114 is opened in a pad nitride 114 open step, shown in FIG. 8. The pad nitride 114 open step preferably comprises exposing the wafer 100 to a gas 138 selective to oxide, e.g., a dry etch comprising $CHF_3$. Preferably, only the exposed pad nitride 114 is removed, as shown in FIG. 8. Preferably, in particular, the first insulator 130 cap is unaffected by the selective nitride open step and thus the first insulator 130 cap remains intact.

Advantageously, the first insulator 130 deposited by selective $TEOS/O_3$ deposition provides an etch differential, resulting in substantially the entire width of the second semiconductor material 116 within the deep trench 113 being covered by first insulator 130. Thus, the first insulator 130 protects the deep trench poly (second semiconductor material 116) during the STI processing steps.

Figure 9:
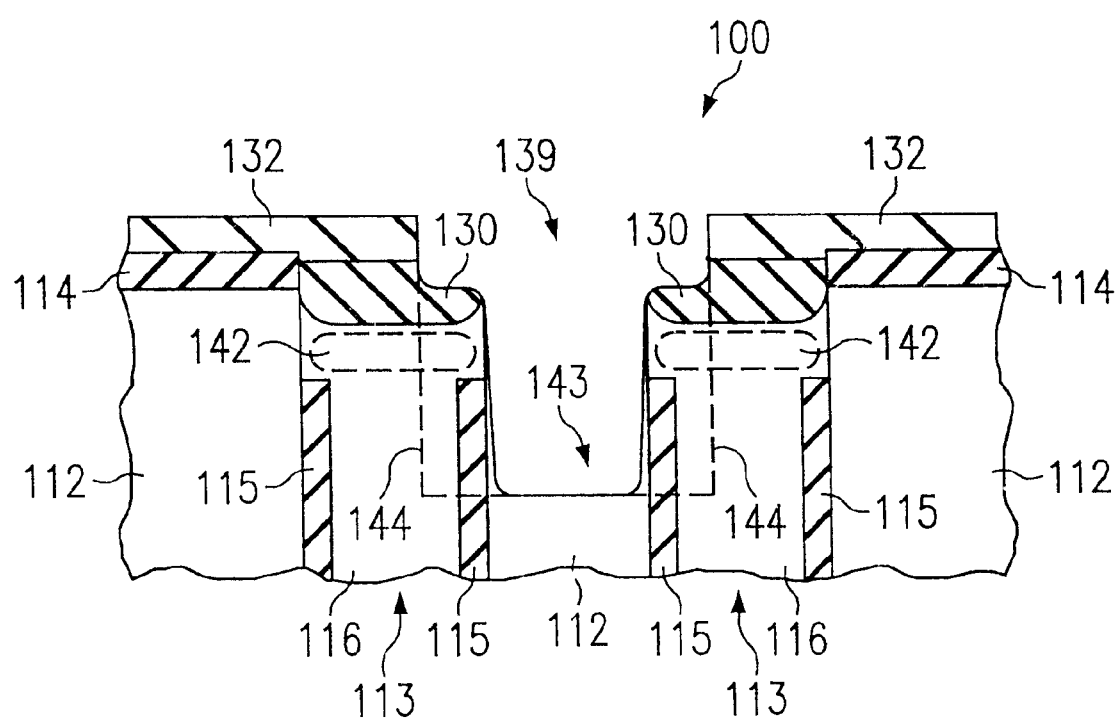

Next, the resist 134 and optional ARC (not shown) are removed, e.g., in a dry strip using oxygen plasma, shown in FIG. 9. Portions of the wafer 100 not covered by the hard mask 132 are etched using an etchant 139 to form shallow trenches 143 within the wafer 100 using the hard mask 132 and first insulator 130 to pattern the trenches 143, opening the STI area 143. The exposed first semiconductor material 112 is removed in a selective etch 139 step. Preferably the etch 139 is selective to the semiconductor material 112, e.g., silicon, so that no first insulator 130 or insulating collar 115 material within deep trenches 113 is removed. The etchant 139 preferably comprises a timed dry etch using HBr and alternatively comprising $NF_3$, Ar, or $O_2$, as examples. Preferably, the first semiconductor material 112 between trenches 113 is etched to a depth sufficient to isolate the two trenches 113 so that element regions of the wafer 100 are electrically isolated. For example, the etch may be to a depth of about 360 nanometers below the bottom of the pad nitride 114. Optionally, the etchant 139 may be changed to a non-selective etchant for a final over-etch step, not shown.

Figure 1:
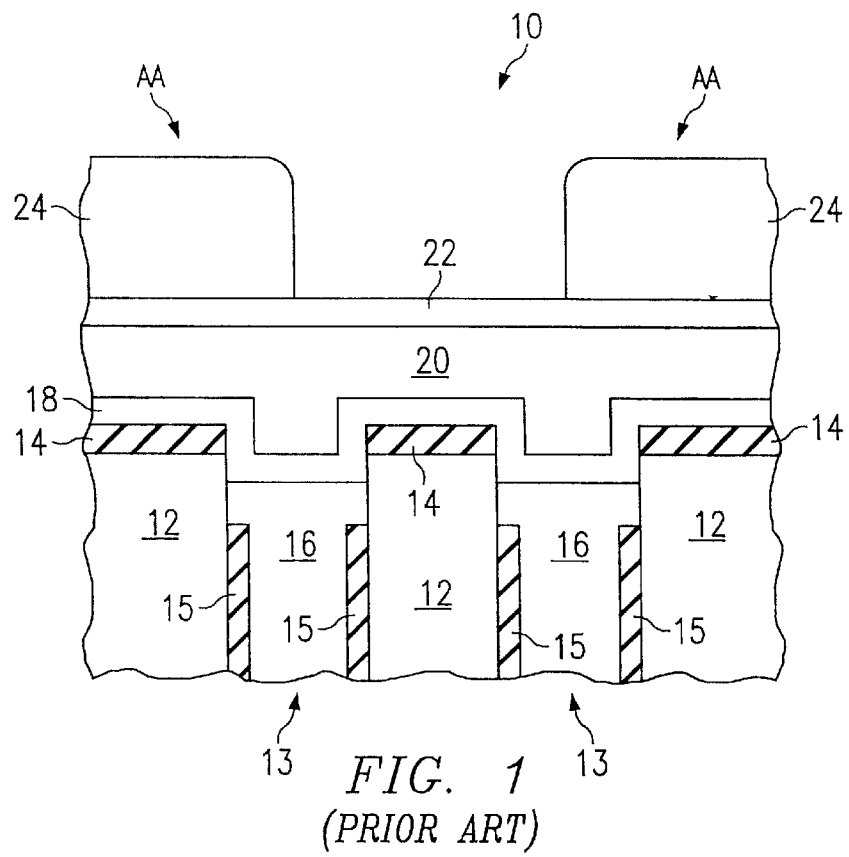
FIGS. 1–3 illustrate cross-sectional views of a prior art DRAM deep trench capacitor having a high strap resistance.
Figure 2:
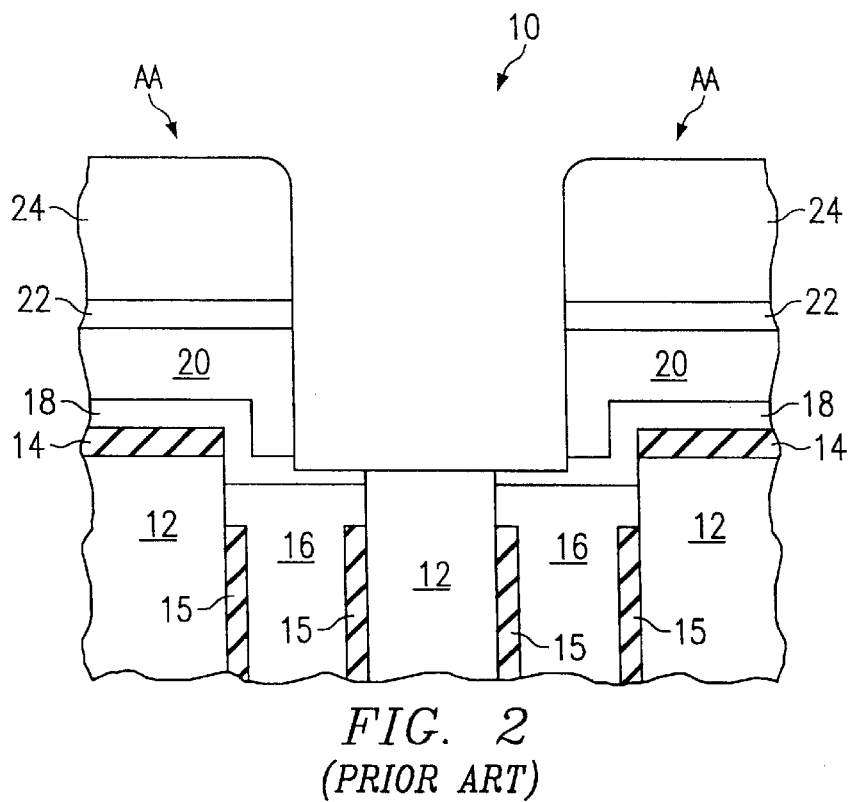
Figure 3:
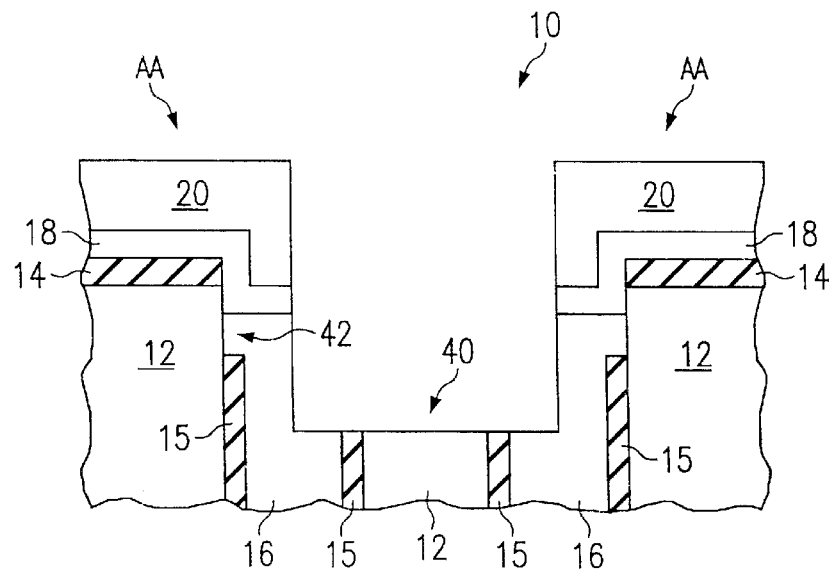

The buried strap region formed in accordance with embodiments of the invention is shown at 142. The buried strap region 142 within second semiconductor material 116 is larger than prior art strap region 42, as can be seen in FIG. 3, because the first insulator 130 cap protects the underlying second semiconductor material 116 during the various etch steps. Because more semiconductor material 116 exists to conduct electricity in accordance with embodiments of the present invention, the strap 142 resistance is lower than in prior art isolation techniques. Shown in phantom at 144 is an outline of the pattern of prior art shallow trench isolation techniques, having a portion of second semiconductor material 116 etched away from inside trenches 113, which increases the strap resistance because less second semiconductor material 116 remains within the trench 113, creating a shorter conduction path.

Figure 10:
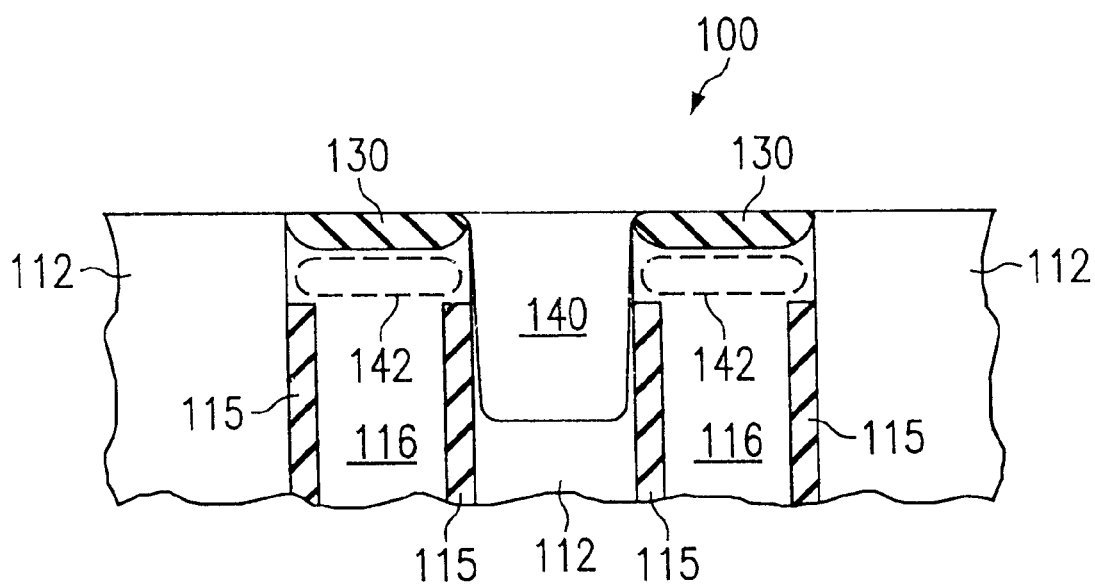

The hard mask 132 may be removed prior to any further processing steps. The trench 143 formed in the first semiconductor material 112 may be filled with a second insulator 140, as shown in FIG. 10. Second insulator 140 preferably comprises an oxide such as $SiO_2$, as an example. The wafer 100 may be polished by a CMP process down to at least the pad nitride layer 114 surface or lower, leaving second insulator 140 in the trenches 143 to provide isolation between devices (not shown).

Embodiments of the present invention provide several advantages over prior art memory semiconductors. Advantages of embodiments of the present invention include providing a memory device 100 having a lower strap 142 resistance. The lowered strap 142 resistance allows for a higher speed memory device 100 than in the prior art, e.g., the time required for the storage and retrieval of information in the deep trench 113 capacitor is reduced. The lowered strap 142 resistance also allows for a lower power memory device 100, because the surrounding supportive circuitry is required to be used for less time than in prior art memory devices, thus embodiments of the invention require lower total power consumption than in the prior art. Because the selective first insulator 130 deposition fills the deep trenches 113, a thinner hard mask 132 may be used, advantageous because smaller lithography scales may be achieved. Because selective deposition and etch processes are used, the buried strap 142 is self-aligned. Lowering the strap 142 resistance also improves device yield and performance.

Embodiments of the present invention are described herein with reference to silicon material.
Alternatively, compound semiconductor materials such as GaAs, InP, Si/Ge, or SiC may be used in place of silicon, as examples.

Embodiments of the invention have been described with reference to a DRAM; however, embodiments of the invention are also beneficial in other semiconductor manufacturing applications that require STI processes, such as in ferroelectric random access memories (FRAMs), as an example.

Embodiments of the invention are particularly useful in embedded DRAMs (eDRAMs) applications, which comprise DRAMs and high performance logic devices embedded on a single chip.

While embodiments of the invention have been described with reference to illustrative embodiments, this description is not intended to be construed in a limiting sense. Various modifications in combinations of the illustrative embodiments, as well as other embodiments of embodiments of the invention, will be apparent to persons skilled in the art upon reference to the description. In addition, the order of process steps may be rearranged by one of ordinary skill in the art, yet still be within the scope of embodiments of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A shallow trench isolation (STI) method for a semiconductor wafer, comprising:
   providing a wafer including a first semiconductor material, the first semiconductor material comprising element regions;
   depositing a pad nitride over the first semiconductor material;
   forming at least two trenches within the first semiconductor material and pad nitride, leaving a portion of first semiconductor material and pad nitride in a region between the two trenches;
   depositing a second semiconductor material over the trenches to fill the trenches to at least a height below the first semiconductor material top surface;
   forming a first insulator over the second semiconductor material; and
   removing at least a portion of the pad nitride and a portion of the first semiconductor material between at least two trenches without removing the first insulator.

2. The method according to claim 1 wherein forming a first insulator comprises exposing the wafer to a gas comprising ozone.

3. The method according to claim 2 wherein forming a first insulator comprises forming an oxide.

4. The method according to claim 3 wherein forming a first insulator comprises exposing the wafer to TEOS to form silicon dioxide.

5. The method according to claim 4 wherein forming the first insulator does not comprise forming the first insulator over the pad nitride.

6. The method according to claim 1, wherein removing a portion of the pad nitride and a portion of the first semiconductor material comprises:
   exposing the wafer to a first etchant to remove the pad nitride portion, the first etchant being selective to nitride; and
   exposing the wafer to a second etchant to remove the first semiconductor material portion, the second etchant being selective to the first semiconductor material.

7. The method according to claim 1, further comprising:
   forming a hard mask over at least the pad nitride;
   depositing a resist over the hard mask; and
   patterning and opening the hard mask.

8. The method according to claim 7, further comprising:
   removing the hard mask, pad nitride and top portion of the first insulator; and
   depositing a second insulator over the etched first semiconductor material.

9. The method according to claim 1 wherein depositing a second semiconductor material comprises depositing polysilicon.

10. A shallow trench isolation (STI) method for a semiconductor wafer, comprising:
    providing a wafer including a first semiconductor material, the first semiconductor material comprising element regions;
    depositing a pad nitride over the first semiconductor material;
    forming at least two trenches within the first semiconductor material and pad nitride, leaving a portion of first semiconductor material and pad nitride in a region between the two trenches;
    depositing a second semiconductor material over the trenches to fill the trenches to at least at height below the first semiconductor material top surface;
    selectively forming a first insulator over the second semiconductor material, wherein selectively forming a first insulator comprises exposing the wafer to a gas comprising ozone, forming an oxide, and exposing the wafer to TEOS to form silicon dioxide, wherein selectively forming the first insulator does not comprise forming the first insulator over the pad nitride; and
    removing the pad nitride and a portion of the first semiconductor material between at least two trenches to isolate element regions of the wafer, wherein removing a portion of the pad nitride and a portion of the first semiconductor material comprises:
       exposing the wafer to a first etchant to remove the pad nitride portion, the first etchant being selective to nitride; and
       exposing the wafer to a second etchant to remove the first semiconductor material portion, the second etchant being selective to the first semiconductor material.

11. The method according to claim 10, further comprising:
    forming a hard mask over at least the pad nitride;
    depositing a resist over the hard mask; and
    patterning and opening the hard mask.

12. The method according to claim 11, further comprising:
    removing the hard mask, pad nitride and top portion of the first insulator; and
    depositing a second insulator over the etched first semiconductor material.

13. The method according to claim 12 wherein depositing a second semiconductor material comprises depositing polysilicon.

14. A method of manufacturing a memory device, the method comprising:
    providing a semiconductor wafer comprising a first semiconductor material;
    depositing a pad nitride over the first semiconductor material;
    forming a plurality of memory cells on the semiconductor wafer, each memory cell including a deep trench proximate an element region, the deep trenches being filled with a second semiconductor material to a height below the top of the first semiconductor material;
    exposing the wafer to a gas comprising ozone to selectively form a first insulator over only the second semiconductor material, wherein the first insulator is not formed over the pad nitride; and
    removing the pad nitride and a portion of the first semiconductor material between at least two of the deep trenches to isolate the element regions of the wafer, wherein removing a portion of the pad nitride and a portion of the first semiconductor material comprises exposing the wafer to a first etchant to remove the pad nitride portion, the first etchant being selective to nitride, and exposing the wafer to a second etchant to remove the first semiconductor material portion, the second etchant being selective to the first semiconductor material.

15. The method according to claim 14 wherein selectively forming a first insulator comprises exposing the wafer to a gas comprising ozone.

16. The method according to claim 15 wherein selectively forming a first insulator comprises forming an oxide.

17. The method according to claim 15 wherein selectively forming a first insulator comprises exposing the wafer to TEOS $O_3$ to form silicon dioxide.

18. The method according to claim 15, further comprising:
- forming a hard mask over at least the pad nitride;
- depositing a resist over the hard mask; and
- patterning and opening the hard mask.

19. The method according to claim 15, further comprising depositing a second insulator over the etched first semiconductor material.

20. The method according to claim 14 wherein the memory device is a DRAM, wherein a top portion of the second semiconductor material comprises a strap coupling a memory cell to an access transistor.

21. A method of manufacturing a memory device, the method comprising:
- providing a semiconductor wafer comprising a first semiconductor material;
- depositing a pad nitride over the first semiconductor material;
- forming a plurality of memory cells on the semiconductor wafer, each memory cell including a deep trench proximate an element region, the deep trenches being filled with a second semiconductor material to a height below the top of the first semiconductor material;
- exposing the wafer to a gas comprising ozone to selectively form a first insulator over only the second semiconductor material, wherein the first insulator is not formed over the pad nitride; and
- removing the pad nitride and a portion of the first semiconductor material between at least two of the deep trenches to isolate the element regions of the wafer, wherein removing a portion of the pad nitride and a portion of the first semiconductor material comprises exposing the wafer to a first etchant to remove the pad nitride between at least two of the deep trenches, the first etchant being selective to nitride, and exposing the wafer to a second etchant to remove the first semiconductor material portion between at least two of the deep trenches, the second etchant being selective to the first semiconductor material.

22. The method according to claim 21 wherein exposing the wafer to a gas comprising ozone comprises exposing the wafer to TEOS $O_3$ to form silicon dioxide over the second semiconductor material.

23. A method of manufacturing a memory device, the method comprising:
- providing a semiconductor wafer comprising a first semiconductor material;
- depositing a pad nitride over the first semiconductor material;
- forming a plurality of memory cells on the semiconductor wafer, each memory cell including a deep trench proximatic an element region, the deep trenches being filled with a second semiconductor material to a height below the top of the first semiconductor material;
- exposing the wafer to a gas comprising ozone to selectively form a first insulator over only the second semiconductor material, wherein the first insulator is not formed over the pad nitride;
- removing the pad nitride and a portion of the first semiconductor material between at least two of the deep trenches to isolate the element regions of the wafer;
- forming a hard mask over at least the pad nitride;
- depositing a resist over the hard mask; and
- patterning and opening the hard mask.

24. A method of manufacturing a memory device, the method comprising:
- providing a semiconductor wafer comprising a first semiconductor material;
- depositing a pad nitride over the first semiconductor material;
- forming a plurality of memory cells on the semiconductor wafer, each memory cell including a deep trench proximate an element region, the deep trenches being filled with a second semiconductor material to a height below the top of the first semiconductor material;
- exposing the wafer to a gas comprising ozone to selectively form a first insulator over only the second semiconductor material, wherein the first insulator is not formed over the pad nitride; and
- removing die pad nitride and a portion of the first semiconductor material between at least two of the deep trenches to isolate the element regions of the wafer, wherein selectively forming a first insulator comprises exposing the wafer to TEOS $O_3$ to form silicon dioxide.

* * * * *